(12) United States Patent
Huang et al.

(10) Patent No.: US 7,834,791 B2
(45) Date of Patent: Nov. 16, 2010

(54) CURRENT STEERING DAC AND VOLTAGE BOOSTER OF SAME

(75) Inventors: San-Yueh Huang, Tainan (TW); Yung-Cheng Chu, Kaohsiung (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 51 days.

(21) Appl. No.: 12/369,867

(22) Filed: Feb. 12, 2009

(65) Prior Publication Data
US 2009/0201186 A1    Aug. 13, 2009

(30) Foreign Application Priority Data
Feb. 12, 2008    (TW) ............................... 97104798 A

(51) Int. Cl.
*H03M 1/66*    (2006.01)
(52) U.S. Cl. .................. 341/144; 323/315; 323/316
(58) Field of Classification Search ............... 323/315, 323/316; 341/144, 133, 134, 135, 136, 153
See application file for complete search history.

(56) References Cited

U.S. PATENT DOCUMENTS

| 4,616,418 | A | 10/1986 | Wade, III |
| 5,798,723 | A | 8/1998 | Fong |
| 5,945,851 | A | 8/1999 | Tu et al. |
| 6,369,734 | B2 | 4/2002 | Volk |
| 6,414,618 | B2 | 7/2002 | Bult et al. |
| 6,472,930 | B1 | 10/2002 | Morimoto et al. |
| 6,556,462 | B1 * | 4/2003 | Steigerwald et al. .......... 363/89 |

* cited by examiner

*Primary Examiner*—Jean B Jeanglaude
(74) *Attorney, Agent, or Firm*—Winston Hsu; Scott Margo

(57) ABSTRACT

A digital-to-analog converter is coupled to a first voltage source and used for converting a digital input into an analog output. The DAC includes a voltage booster providing a first gate-source voltage and a second gate-source voltage to generate a voltage of a first level according to the first voltage source and the first gate-source voltage, and to generate a voltage of a second level according to the voltage of the first level and the second gate-source voltage; and a current-guiding circuit selectively receiving the voltage of the first level or the second level according to the digital input to generate the analog output. The first level and the second level vary with the first voltage source.

16 Claims, 9 Drawing Sheets

US 7,834,791 B2

CURRENT STEERING DAC AND VOLTAGE BOOSTER OF SAME

FIELD OF THE INVENTION

The present invention relates to a current steering digital-to-analog converter (DAC), and more particularly to a current steering DAC with a voltage booster.

BACKGROUND OF THE INVENTION

A digital-to-analog converter (DAC) is one of the common and important elements used in current analog integrated circuitry. Particularly for a communication system including analog IC circuitry, the performance of the communication system highly depends on the quality of the DAC design. One type of DACs, e.g. current steering DACs, is adapted for high-speed and high-resolution digital-to-analog conversion in IC circuitry of a communication system.

Please refer to FIG. 1A, in which a differential current steering DAC is shown. The DAC includes a current source Iin, two PMOS transistors P1 and P2, and two resistors R1 and R2, wherein the current source is coupled between a first voltage source Vdd and a node "a"; the sources of the transistors P1 and P2 are coupled to the node "a"; the gates of the transistors P1 and P2 are coupled to control signal ends C1 and C2, respectively; the drains of the transistors P1 and P2 are differential voltage output terminals V+ and V−; the resistor R1 is coupled between the drain of the transistor P1 and a second voltage source Vss; the resistor R2 is coupled between the drain of the transistor P2 and the second voltage source Vss; the resistors R1 and R2 have equal resistance; and the second voltage source Vss is typically of ground voltage. The DAC as shown in FIG. 1A has a differential architecture and is capable of eliminating common mode noise.

The control signal ends C1 and C2 respectively receive complement digital signals for controlling the transistors P1 and P2 to turn on or turn off. For example, when the control signal at the control signal end C1 turns on the transistor P1, current flows through the resistor R1 so as to generate analog voltages at the differential voltage output terminals V+ and V−. On the other hand, when the control signal at the control signal end C2 turns on the transistor P2, current flows through the resistor R2 so as to generate analog voltages at the differential voltage output terminals V+ and V−.

Please refer to FIG. 1B, which illustrates waveforms of control signals at the control signal ends C1 and C2. Since the control signals are complementary to each other, the control signal at the end C2 is at a low level, e.g. Vss, while the control signal at the end C1 is at a high level, e.g. Vdd. On the other hand, the control signal at the end C2 is at a high level, e.g. Vdd, while the control signal at the end C2 is at a low level, e.g. Vss. Since the current steering DAC as shown in FIG. 1A is implemented with P-type transistors, the high level is a turn-off voltage while the low level is a turn-on voltage.

In the above-described current steering DAC, the turn-off voltage and the turn-on voltage are implemented with the first voltage source Vdd and the second voltage source Vss, respectively. Accordingly, the voltage difference between the high level (Vdd) and the low level (Vss) is too large to achieve a satisfactory operating speed. In addition, a drawback of too much noise would be rendered.

Please refer to FIG. 1C, which illustrates the circuitry of a single-ended current steering DAC. The current steering DAC includes a current source Iin, two PMOS transistors P1 and P2 and a resistor R1. The current source Iin is coupled between a first voltage source Vdd and a node "a"; the sources of the transistors P1 and P2 are coupled to the node "a"; the gates of the transistors P1 and P2 are respectively coupled to a control signal end C1 and a reference voltage Vref; the drain of the transistor P1 is coupled to a second voltage source Vss; the drain of the transistor P2 is coupled to a voltage output end Vout; and the resistor R1 is coupled between the drain of the drain of the transistor P2 and the second voltage source Vss. Since the current steering DAC is single-ended, the second voltage source (Vss) is typically ground voltage. Furthermore, the control signal end may receive a digital signal which is referred to so as to turn on or turn off the transistor P1, and thereby generates an analog voltage at the voltage output end Vout.

Please refer to FIG. 1D, which illustrates the waveform of the control signal at the control signal end C1. Since the control signal is digital, the high level is a turn-off voltage while the low level is a turn-on voltage.

In the above-described current steering DAC, likewise, the turn-off voltage and the turn-on voltage are implemented with the first voltage source Vdd and the second voltage source Vss, respectively. Accordingly, the voltage difference between the high level (Vdd) and the low level (Vss) is too large to achieve a satisfactory operating speed. In addition, a similar drawback of too much noise would be rendered.

In order to enhance operating speed and reduce noise, U.S. Pat. No. 6,369,734 discloses method and apparatus for increasing linearity and reducing noise coupling in a digital to analog converter, as shown in FIG. 2. The DAC includes transistors 402, 404 and 406, wherein from the gates of the transistors 404 and 406, a pair of complementary control signals are inputted. In the DAC, a bias circuit 430 is provided and includes a resistor divider consisting of resistors 416 and 418. The resistor divider divides a voltage source Vdd and the divided voltage Va is outputted through a voltage buffer 414, wherein Va=Vdd*$R_{418}$/($R_{416}$+$R_{418}$) where $R_{418}$ is the resistance of the resistor 418 and $R_{416}$ is the resistance of the resistor 416. Furthermore, the voltage source Vdd and the divided voltage Va are coupled to the power inputs of the Not Gates 408 and 410. In other words, the high level of the Not Gates 408 and 410 will be equal to the voltage source Vdd while the low level will be equal to the divided voltage Va. It is also understood from the above descriptions that the high level of the control signal, i.e. turn-off voltage, is equal to the power voltage Vdd, and the low level, i.e. turn-on voltage, is equal to the divided voltage Va. Accordingly, the voltage difference between the high level and the low level of the control signal decreases so as to enhance the operating speed of the DAC and reduce noise.

FIG. 3A and FIG. 3B illustrate two further bias circuits disclosed in U.S. Pat. No. 6,369,734. Either of the two bias circuits may be used to replace the bias circuit 430 in the DAC of FIG. 2.

In the bias circuit 430 of FIG. 3A, a diode 450 has its N-type side grounded. Since there is a certain voltage drop, e.g. 0.6V, between the P-type side and the N-type side of the diode 450, the voltage source Vdd and the P-type side voltage Vp are coupled to the power inputs of the Not Gates 408 and 410. In other words, the high level of the Not Gates 408 and 410 will be equal to the voltage source Vdd while the low level will be equal to the P-type side voltage Vp.

In the bias circuit 430 of FIG. 3B, a divider circuit consisting of a P-type transistor 452 and an N-type transistor 454 is provided to generate a divided voltage Vb. The voltage source Vdd and the divided voltage Vb are coupled to the power inputs pf the Not Gates 408 and 410. In other words, the high level of the Not Gates 408 and 410, i.e. turn-off voltage, will be substantially equal to the voltage source Vdd while the low level, i.e. turn-on voltage, will be substantially equal to the divided voltage Vb.

U.S. Pat. No. 6,414,618 also discloses a digital to analog converter with reduced ringing for enhancing operating speed and reducing noise, as shown in FIG. 4A. The DAC includes transistors 170, 172, 174 and 176 and resistors 178 and 180, wherein the transistors 170 and 172 serve as a current source. The DAC further includes transistors 182, 184, 188 and 190 serving as a switch for providing a digital control signal, e.g. with a high level Vref1 serving as a turn-off voltage or with a low level Vref2 serving as a turn-on voltage, to the gates of the transistors 174 and 176. A bias circuit of the DAC includes transistors 162, 164, 166 and 168 connected between voltage sources Vdda and Vssa in series, wherein the transistors 166 and 168 are arranged in diode connection. In this case, the low level Verf2 is about 0.6V+Vssa and the high level Vref1 is about 1.2V+Vssa. Accordingly, the reduced voltage difference between the high level and the low level of the control signal results the enhancement of the operating speed of the DAC and the reduction of noise.

FIG. 4B illustrates the waveform of the control signal in the DAC of FIG. 4A. Since the control signals inputted into the gates of the transistors 174 and 176 are complementary digital signals, the high level Vref1 of the control signal serves as a turn-off voltage and the low level Vref2 serves as a turn-on voltage.

It is understood that the operating speed of the DAC can be enhanced and noise can be reduced by reducing the voltage difference between the high level and the low level of the control signal. However, once the DAC and the bias circuit are produced, the high level and the low level of the control signal are unchangeable and cannot be modified with practical design. If the IC circuitry has any shift during manufacturing, a preset constant low level (turn-on voltage) would not be proper anymore as there are one or more PMOS transistors entering a triode region. Then the operating speed of the DAC will be adversely affected and the preferable swing range cannot be found because the best bias is not well located.

For example, referring again to FIG. 4A, when the low level (turn-on voltage) of the DAC is too low, the PMOS transistors 174 and 176 will enter a triode region. On the other hand, if the low level (turn-on voltage) of the DAC is too high, the PMOS transistor 172 included in the current source will enter a triode region. Accordingly, the operating speed of the DAC will be deteriorated and non-linear distortion will be rendered.

SUMMARY OF THE INVENTION

Therefore, the present invention provides a current steering digital-to-analog converter with an optimal bias and a wide swing range. The objective can be achieved by providing a voltage booster to dynamically adjust the low level of the control signal.

The present invention provides a digital-to-analog converter for converting a digital input into an analog output. The DAC is coupled to a first voltage source and includes a voltage booster providing a first gate-source voltage and a second gate-source voltage to generate a voltage of a first level according to the first voltage source and the first gate-source voltage and generate a voltage of a second level according to the voltage of the first level and the second gate-source voltage; and a current-guiding circuit selectively receiving the voltage of the first level or the second level according to the digital input to generate the analog output; wherein the first level and the second level vary with the first voltage source.

The present invention also provides a voltage booster of a digital-to-analog converter, which includes a first transistor having at least two electrodes and providing a first voltage between electrodes; and a second transistor having at least two electrodes and providing a second voltage between electrodes; wherein a voltage of a first level is generated according to a first voltage source and the first voltage between electrodes, a voltage of a second level is generated according to the first level and the second voltage between electrodes, and the voltage of the first level or the second level is selectively provided for the digital-to-analog converter to generate an analog output according to a digital input.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1A:
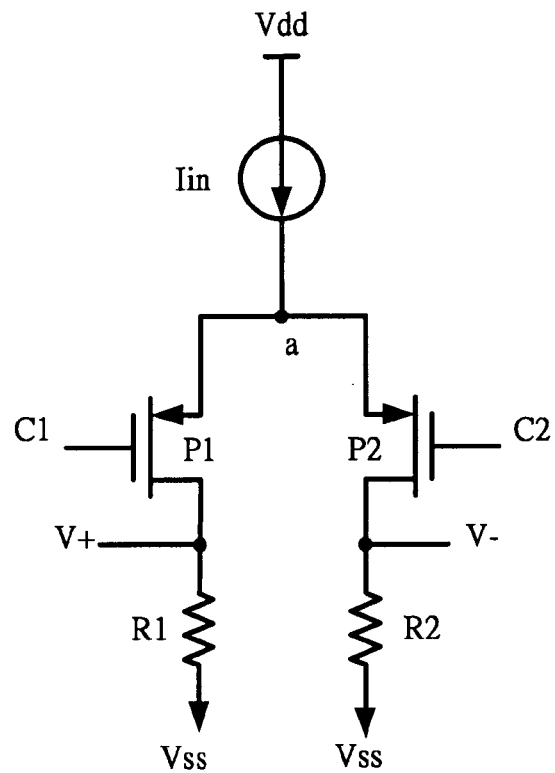
FIG. 1A is a circuit diagram illustrating a differential current steering DAC.
Figure 1B:
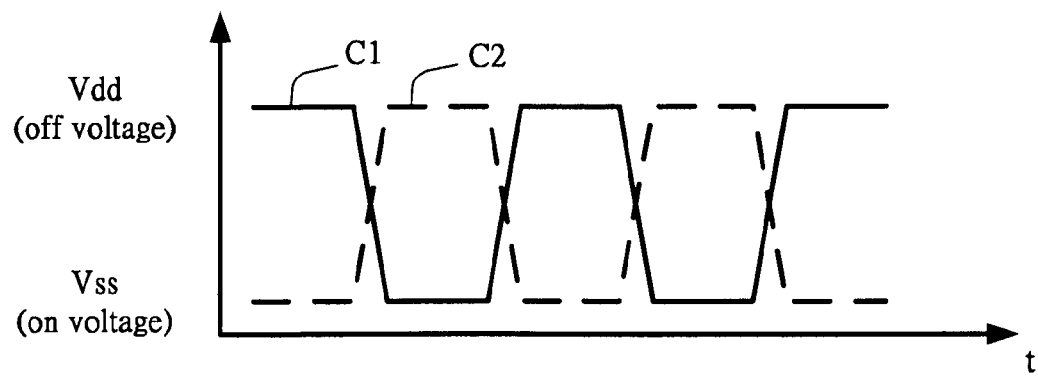
FIG. 1B is a waveform diagram illustrating control signals at control ends C1 and C2.
Figure 1C:
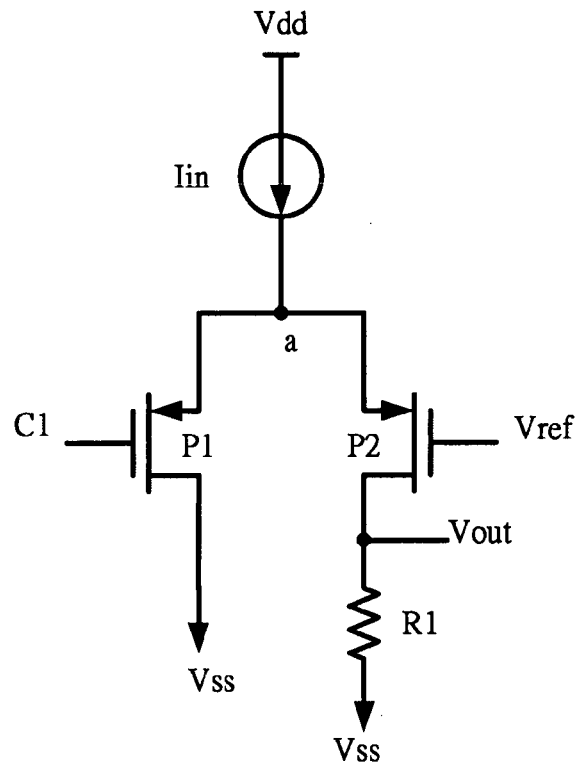
FIG. 1C is a circuit diagram illustrating a single-ended current steering DAC.
Figure 1D:
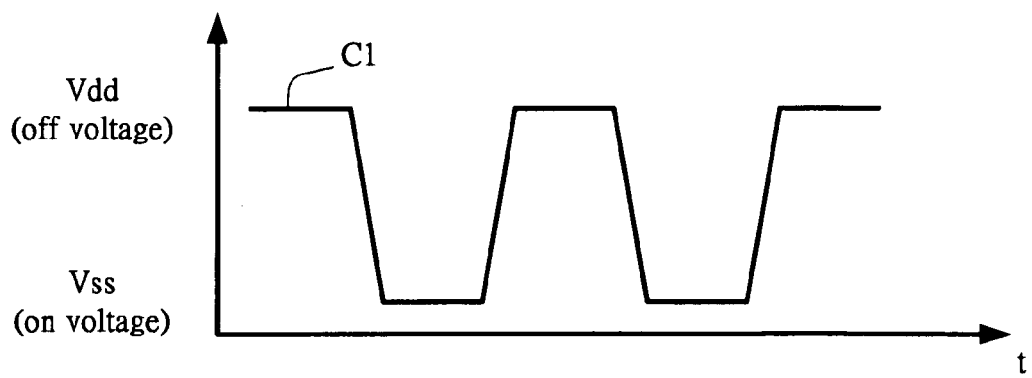
FIG. 1D is a waveform diagram illustrating a control signal at a control end C1.
Figure 2:
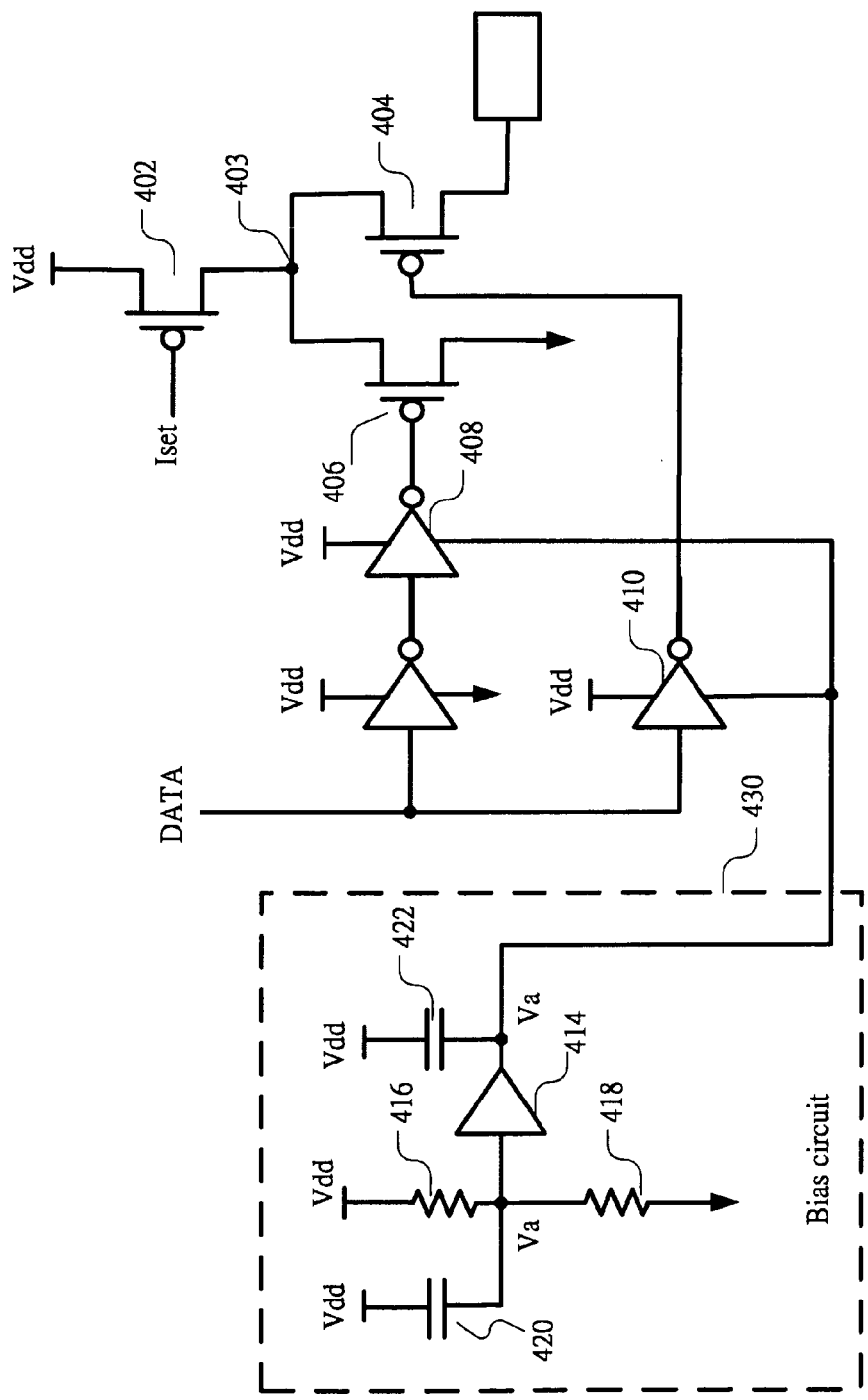
FIG. 2 is a circuit diagram illustrating a DAC and a bias circuit thereof disclosed in U.S. Pat. No. 6,369,734.
Figure 3A:
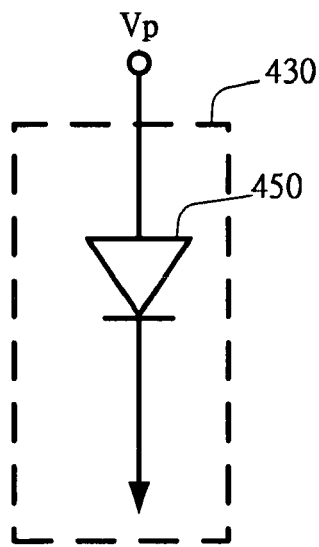
FIG. 3A and FIG. 3B are circuit diagrams illustrating two alternative bias circuits used in the DAC of FIG. 2.
Figure 3B:
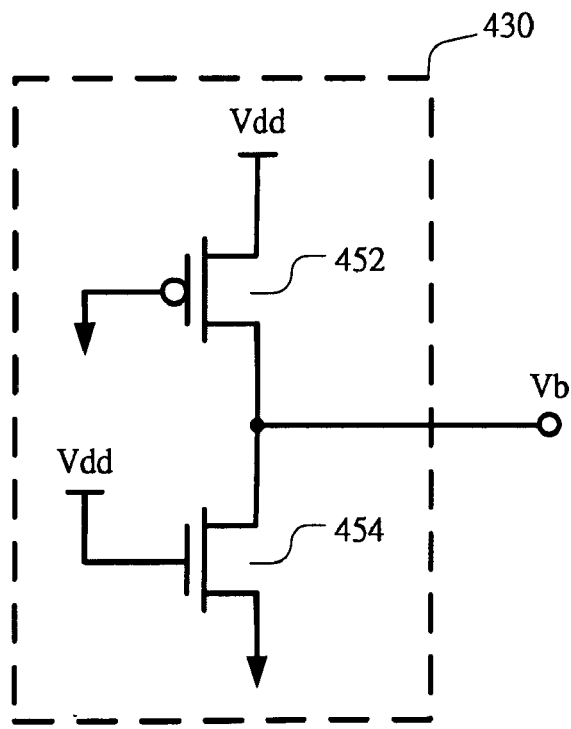
Figure 4A:
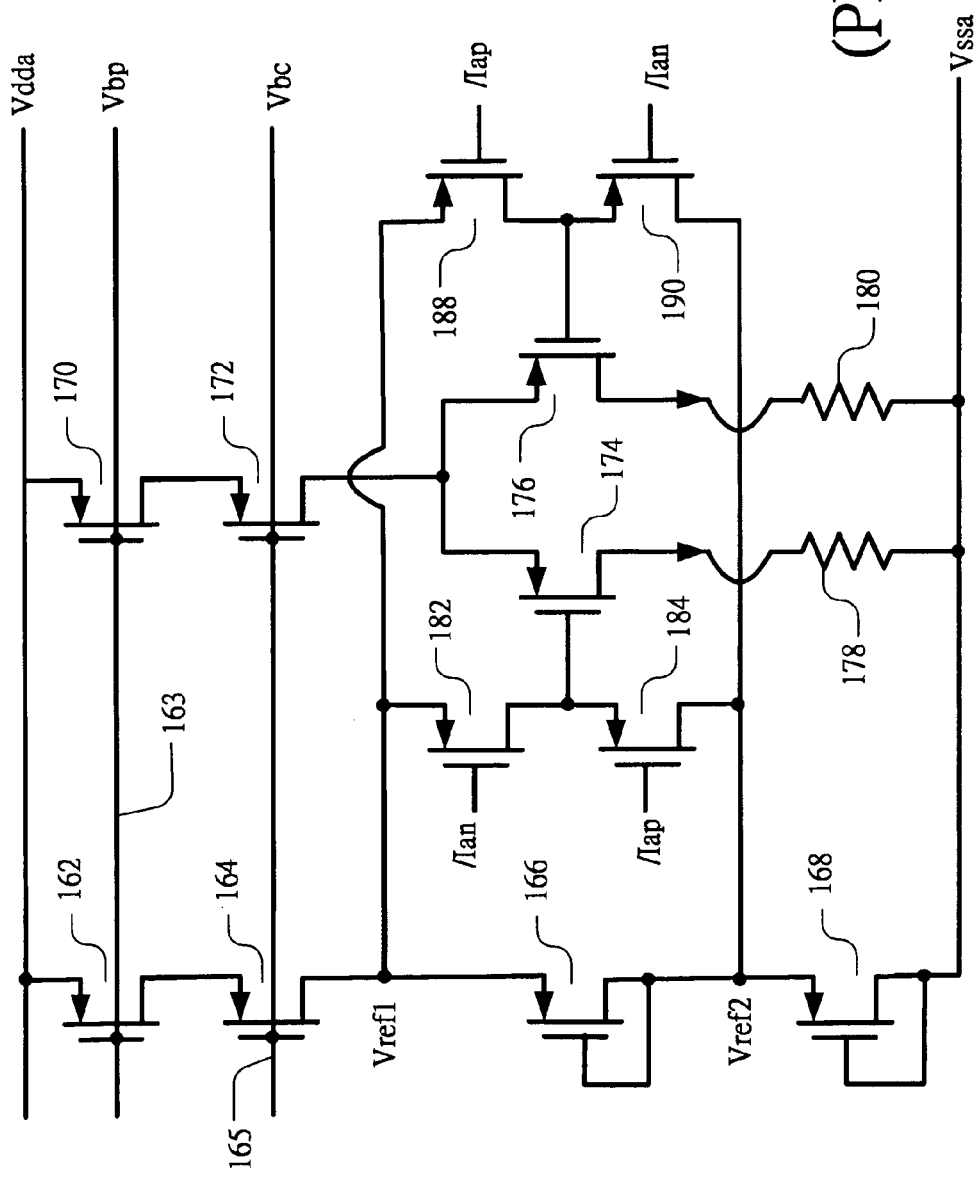
FIG. 4A is a circuit diagram illustrating a DAC and a bias circuit thereof disclosed in U.S. Pat. No. 6,414,618.
Figure 4B:
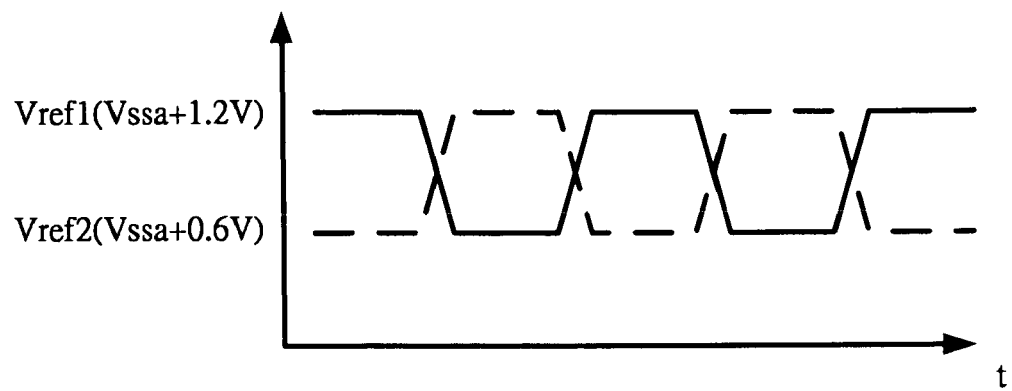
FIG. 4B is a waveform diagram illustrating a control signal at a control end of FIG. 4A.
Figure 5:
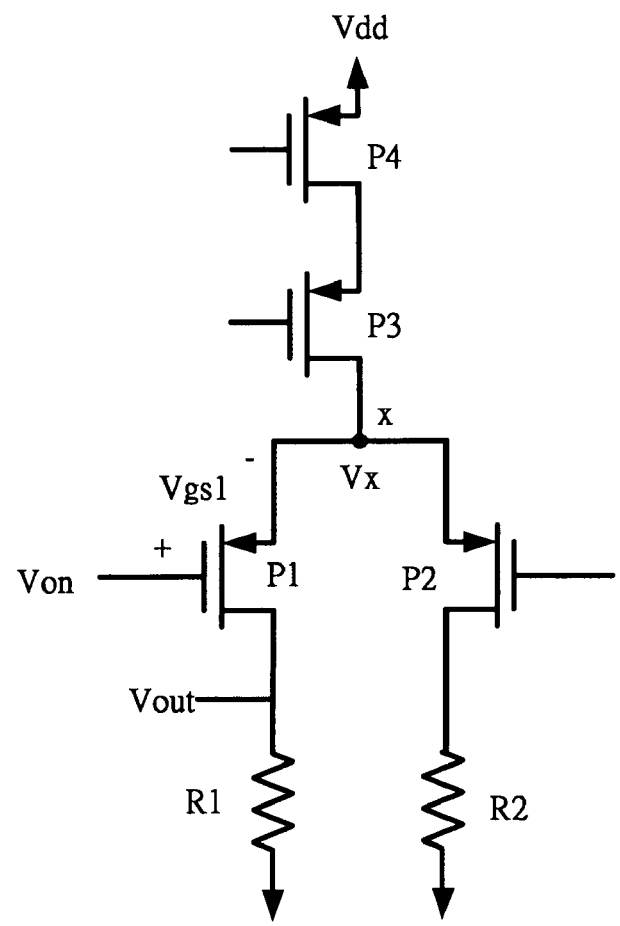
FIG. 5 is a circuit diagram illustrating a typical current steering DAC.

Please refer to FIG. 5, which illustrates a current steering digital-to-analog converter (DAC) functioning as a current-guiding circuit. The current steering DAC includes two PMOS transistors P1 and P2 serving as a switch circuit, two resistors R1 and R2 serving as a load circuit, and PMOS transistors P3 and P4 serving as a current source circuit for providing a reference current. The current source circuit consisting of the serially connected PMOS transistors P3 and P4 is coupled between a voltage source Vdd and a node "x". A condition for the PMOS transistor P1 to operate in a saturation region is $V_x - V_{out} > V_x - V_{on} - |V_{t\_p1}|$, where $V_x$ is the voltage at the node "x", $V_{out}$ is the output voltage, $V_{t\_p1}$ is the threshold voltage of the PMOS transistor P1 and $V_{on}$ is a low level for turning on the PMOS transistor P1. Accordingly, it is realized that $$V_{on} > V_{out} - |V_{t\_p1}| \quad (1).$$

On the other hand, a condition for the PMOS transistors P3 and P4 to operate in a saturation region is $V_{dd} - V_x = V_{dd} - (V_{on} + V_{gs1}) > 2V_{ds}$ where $V_{gs1}$ is the gate-source voltage of the PMOS transistor P1 and $2V_{ds}$ is a voltage difference between the source of the PMOS transistor P4 and the drain of the PMOS transistor P3. For design margin consideration, 2Vds is usually designed to be larger than 300 mV to keep P3 and P4 operated in saturation regions. Accordingly, it is realized that $$V_{on} < V_{dd} - V_{gs1} - 2V_{ds} \quad (2).$$

Based on formulae (1) and (2), it is realized that $$V_{dd} - V_{gs1} - 2V_{ds} > V_{on} > V_{out} - |V_{t\_p1}| \quad (3).$$

A voltage booster used in a current steering DAC according to the present invention is designed based on the formula (3).

Figure 6:
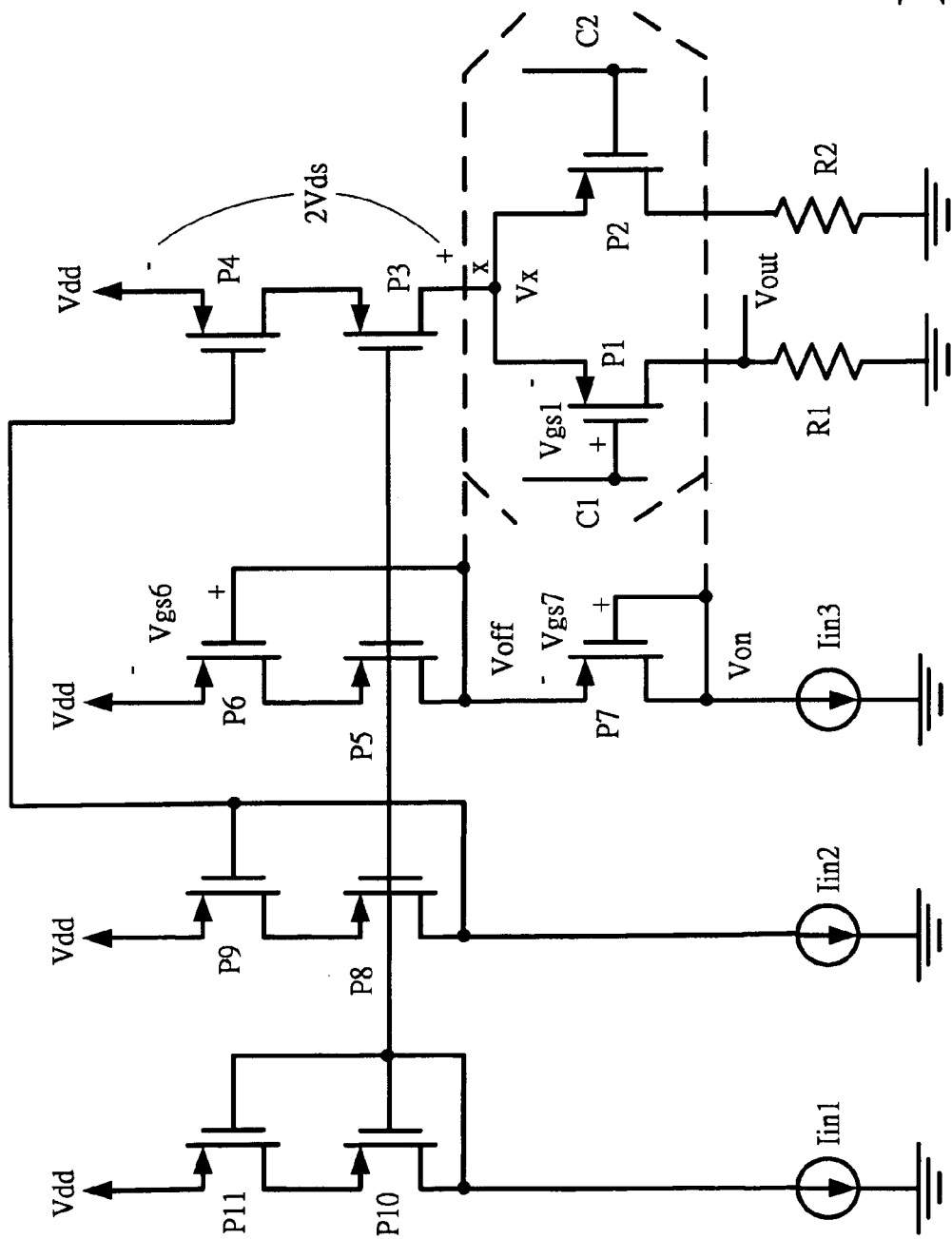
FIG. 6 is a circuit diagram illustrating a current steering DAC and a voltage booster thereof according to an embodiment of the present invention.

Please refer to FIG. 6, which illustrates a current steering DAC and a voltage booster of the DAC according to an embodiment of the present invention. As shown in FIG. 6, PMOS transistors P3, P4, P8, P9, P10 and P11 are interconnected to form a wide-swing cascade current mirror, wherein the PMOS transistors P11 and P10 and a first current source Iin1 are connected between the voltage source Vdd and ground in series; the PMOS transistors P9 and P8 and a second current source Iin2 are connected between the voltage source Vdd and ground in series; the gate of the PMOS transistor P3 is coupled to the gate and drain of the PMOS transistor P10, the gate of the PMOS transistor P11 and the gate of the PMOS transistor P8; and the gate of the PMOS transistor P4 is coupled to the gate of the PMOS transistor P9 and the drain of the PMOS transistor P8.

The voltage booster further includes PMOS transistors P6, P5 and P7 and a third current source Iin3 connected between the first voltage source Vdd and ground (a second voltage source) in series, wherein the gate and drain of the PMOS transistor P7 are connected to each other and the node voltage is equal to the low level $V_{on}$ for turning on the PMOS transistor P1; the gate of the PMOS transistor P6 is coupled to the source of the PMOS transistor P7 and the node voltage is equal to a high level $V_{off}$ for turning off the PMOS transistor P1; and the gate of the PMOS transistor P5 is coupled to the gate of the PMOS transistor P3. Furthermore, as indicated by the dash lines, two control ends C1 and C2 of the DAC receives either the low level $V_{on}$ or the high level $V_{off}$ according to digital inputs so as to control analog outputs through the resistors R1 and R2. In the voltage booster, a voltage difference between the voltage source Vdd and a gate-source voltage $V_{gs6}$ provided through the transistor P6 may serve as a reference voltage. The present voltage booster then provides the high level $V_{off}$ according to the reference voltage. Furthermore, since the gate of the transistor P6 is directly connected to the transistor P7, the reference voltage to the transistor P6 is directly coupled to the source of the transistor P7 so as to provide the high level $V_{off}$. Then a voltage difference between the high level $V_{off}$ and a gate-source voltage $V_{gs7}$ provided through the transistor P7 may serve as the low level $V_{on}$ of the voltage booster.

In an embodiment of the present invention, the PMOS transistors P6 and P4 are compatible (matched), e.g. with the same size; the PMOS transistors P5 and P3 are compatible, e.g. with the same size; and the PMOS transistors P7 and P2 are compatible, e.g. with the same size.

As shown in FIG. 6 and as indicated by Formula (3), when the gate of the PMOS transistor P1, i.e. the control end C1, is coupled to the voltage $V_{on}$, a condition for the transistors P3 and P4 to operate in a saturation region is $V_{dd} - V_{gs1} - 2V_{ds} > V_{on} = V_{dd} - V_{gs6} - V_{gs7}$. Since the PMOS transistors P7 and P1 have the same size such that $V_{gs1} = V_{gs7}$, formulae $V_{gs6} > 2V_{ds}$ and $V_x = V_{dd} - V_{gs6}$ are complied with. Due to the compatibility of transistors, the transistor P7 functions as a replica switch and the transistors P5 and P6 function as a replica current source.

In other words, as long as Formula $V_{gs6} > 2V_{ds}$ is complied with, PMOS transistors P1, P2, P3 and P4 will be able to operate in saturation regions no matter if deviations on the voltage source Vdd, temperature and/or manufacturing conditions (like parameter shift or drift) occur. In addition, the voltage $V_x$ at the node "x" will be around $V_{dd} - V_{gs6}$. Even when deviation of the voltage source Vdd occurs, the high/low level $V_{off}/V_{on}$ for driving the current-guiding circuit according to the present invention will be synchronously adjusted with the deviation so as to maintain the performance and operational property of the present DAC.

Figure 7:
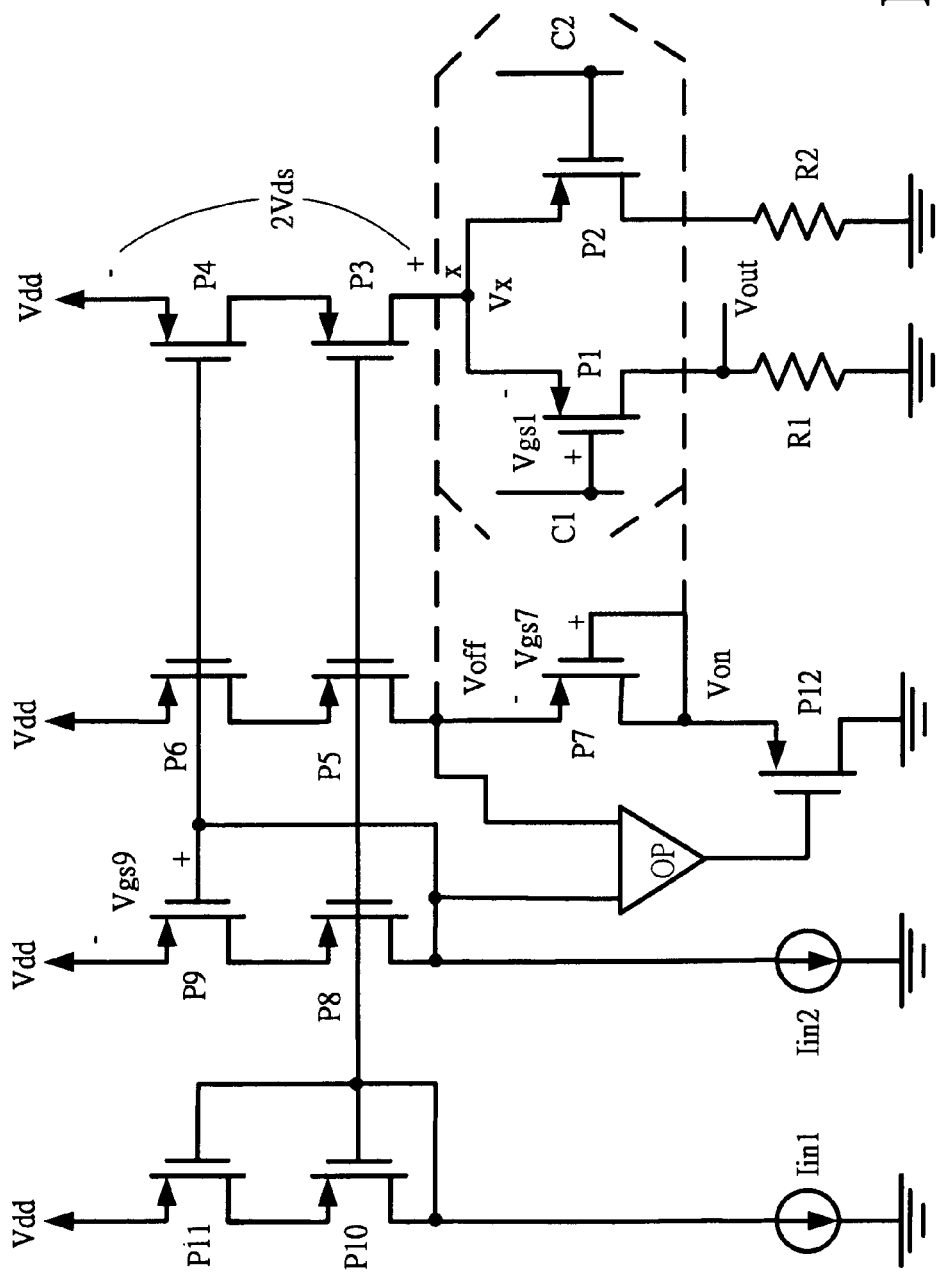
FIG. 7 is a circuit diagram illustrating a current steering DAC and a voltage booster thereof according to another embodiment of the present invention.

Please refer to FIG. 7, which illustrates a current steering DAC and a voltage booster of the DAC according to another embodiment of the present invention. As shown in FIG. 7, PMOS transistors P3, P4, P8, P9, P10 and P11 are interconnected to form a wide-swing cascade current mirror, wherein the PMOS transistors P11 and P10 and a first current source Iin1 are connected between the voltage source Vdd and ground in series; the PMOS transistors P9 and P8 and a second current source Iin2 are connected between the voltage source Vdd and ground in series; the gate of the PMOS transistor P3 is coupled to the gate and drain of the PMOS transistor P10, the gate of the PMOS transistor P11 and the gate of the PMOS transistor P8; and the gate of the PMOS transistor P4 is coupled to the gate of the PMOS transistor P9 and the drain of the PMOS transistor P8.

The voltage booster further includes PMOS transistors P6, P5, P7 and P12 connected between the first voltage source Vdd and ground in series and an operational amplifier OP, wherein the gate and drain of the PMOS transistor P7 are connected to each other and the node voltage is equal to the low level $V_{on}$ for turning on the PMOS transistor P1; the node voltage at the source of the PMOS transistor P7 is equal to the high level $V_{off}$ for turning off the PMOS transistor P1; the gate of the PMOS transistor P6 is coupled to the gate of the PMOS transistor P4; the gate of the PMOS transistor P5 is coupled to the gate of the PMOS transistor P3; two input ends of the operational amplifier OP are coupled to drain of the PMOS transistor P8 and the source of the PMOS transistor P7; and an output end of the operational amplifier OP is coupled to the gate of the PMOS transistor P12. Similar to the architecture of FIG. 6, a gate-source voltage $V_{gs9}$ provided at the gate of the transistor P9 may serve as a reference voltage. Furthermore, a virtual-short-circuit feature of the operational amplifier OP may serve as a connection circuit to have the reference voltage coupled to the source of the transistor P7 so as to provide the high level $V_{off}$. On the other hand, the transistor P7 provides another gate-source voltage $V_{gs7}$ so that the low level $V_{on}$ resulting from a voltage different between the high level $V_{off}$ and the gate-source voltage $V_{gs7}$ is provided at the drain of the transistor P7.

In an embodiment of the present invention, the PMOS transistors P9, P6 and P4 have the same size; the PMOS transistors P8, P5 and P3 have the same size; and the PMOS transistors P7, P2 and P1 have the same size.

As shown in FIG. 7 and as indicated by Formula (3), when the operational amplifier OP operates normally, i.e. the voltages at input ends are equal, and the gate of the PMOS transistor P1 is coupled to the low level $V_{on}$, Formula $V_{dd}-V_{gs1}-2V_{ds}>V_{on}=V_{dd}-V_{gs9}-V_{gs7}$ is complied with. Since the PMOS transistors P7 and P1 have the same size so that $V_{gs1}=V_{gs7}$, Formulae $V_{gs9}>2V_{ds}$ and $V_x=V_{dd}-V_{gs9}$ are complied with.

In other words, as long as Formula $V_{gs9}>2V_{ds}$ is complied with, PMOS transistors P1, P2, P3 and P4 will be able to operate in saturation regions no matter if deviations on the voltage source Vdd, temperature and/or manufacturing conditions occur. In addition, the voltage $V_x$ at the node "x" will be around $V_{dd}-V_{gs9}$.

Figure 8:
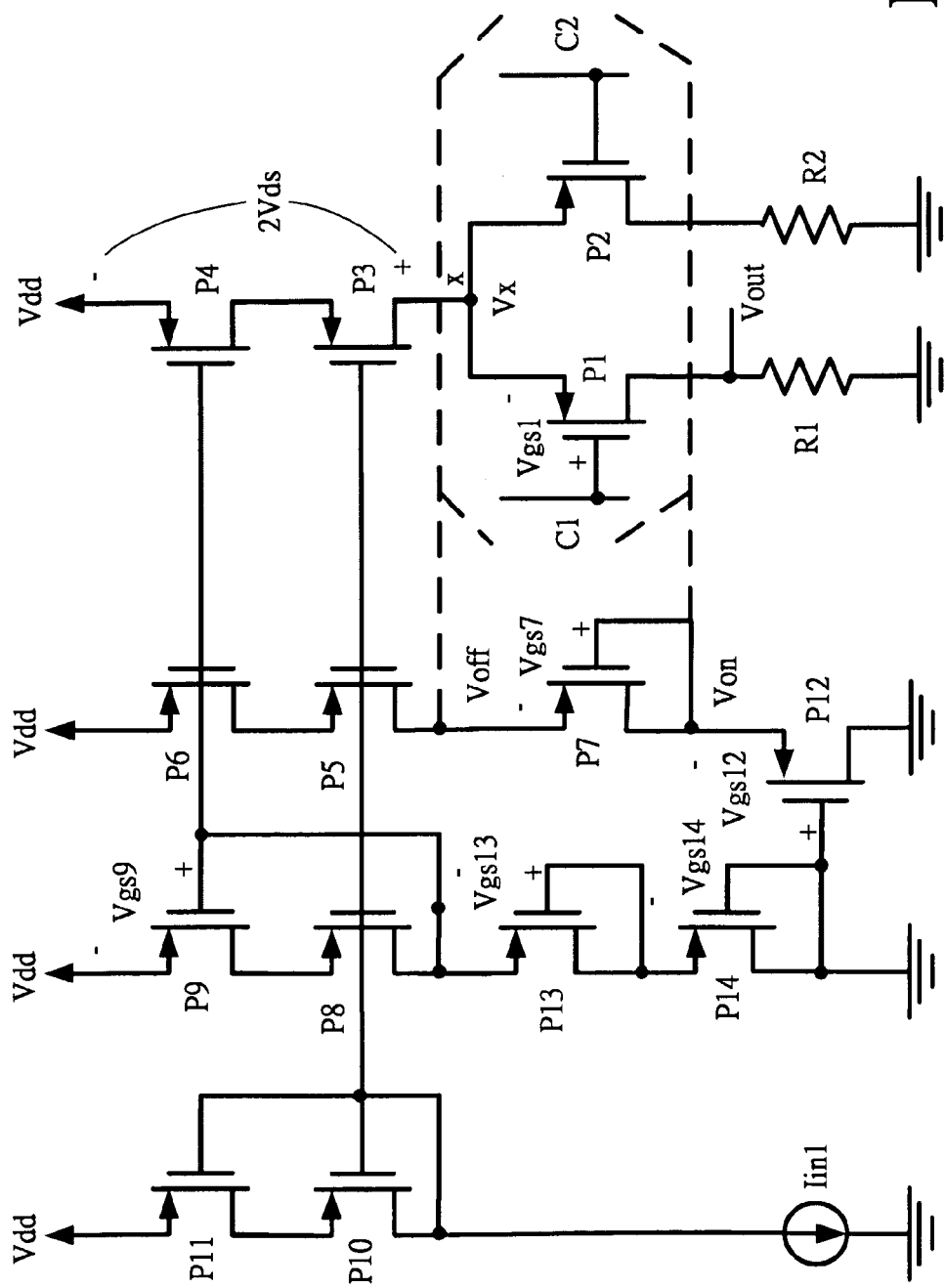
FIG. 8 is a circuit diagram illustrating a current steering DAC and a voltage booster thereof according to a further embodiment of the present invention.

Please refer to FIG. 8, which illustrates a current steering DAC and a voltage booster of the DAC according to a further embodiment of the present invention. As shown in FIG. 8, PMOS transistors P3, P4, P8, P9, P10, P11, P13 and P14 are interconnected to form a wide-swing cascade current mirror, wherein the PMOS transistors P11 and P10 and a first current source Iin1 are connected between the voltage source Vdd and ground in series; the PMOS transistors P9, P8, P13 and P14 are connected between the voltage source Vdd and ground in series; the gate and drain of the PMOS transistor P13 are coupled to each other; the gate and drain of the PMOS transistor P14 are coupled to each other; the gate of the PMOS transistor P3 is coupled to the gate and drain of the PMOS transistor P10, the gate of the PMOS transistor P11 and the gate of the PMOS transistor P8; and the gate of the PMOS transistor P4 is coupled to the gate of the PMOS transistor P9 and the drain of the PMOS transistor P8.

The voltage booster further includes PMOS transistors P6, P5, P7 and P12 connected between the first voltage source Vdd and ground in series, wherein the gate and drain of the PMOS transistor P7 are connected to each other and the node voltage is equal to the low level $V_{on}$ for turning on the PMOS transistor P1; the node voltage at the source of the PMOS transistor P7 is equal to the high level $V_{off}$ for turning off the PMOS transistor P1; the gate of the PMOS transistor P6 is coupled to the gate of the PMOS transistor P4; the gate of the PMOS transistor P5 is coupled to the gate of the PMOS transistor P3; and the gate of the PMOS transistor P12 is coupled to drain of the PMOS transistor P14.

In an embodiment of the present invention, the PMOS transistors P9, P6 and P4 have the same size; the PMOS transistors P8, P5 and P3 have the same size; the PMOS transistors P13, P7, P2 and P1 have the same size; and the PMOS transistors P14 and P12 have the same size.

As shown in FIG. 8 and as indicated by Formula 3, when the PMOS transistors P13 and P14 are connected to form a source follower circuit ($V_{gs14}=V_{gs12}$) and the gate of the PMOS transistor P1 is coupled to the low level $V_{on}$, Formula $V_{dd}-V_{gs1}-2V_{ds}>V_{on}=V_{dd}-V_{gs9}-V_{gs7}$ is complied with. Since the PMOS transistors P13, P7 and P1 have the same size so that Formula $V_{gs1}=V_{gs7}=V_{gs13}$ is complied with, Formulae $V_{gs9}>2V_{ds}$ and $V_x=V_{dd}-V_{gs9}$ are complied with. In other words, the transistor P13 provides a gate-source voltage $V_{gs13}$ so that the source follower may couple a voltage different between the gate voltage of the transistor P9 and the gate-source voltage $V_{gs13}$ to the drain of the transistor P7.

Accordingly, as long as Formula $V_{gs9}>2V_{ds}$ is complied with, PMOS transistors P1, P2, P3 and P4 will be able to operate in saturation regions no matter if deviations on the voltage source Vdd, temperature and/or manufacturing conditions occur. In addition, the voltage $V_x$ at the node "x" will be around $V_{dd}-V_{gs9}$. Furthermore, the low level for turning on the PMOS transistors P1 and P2 will be $V_{dd}-V_{gs9}-V_{gs1}$ and the high level for turning on the PMOS transistors P1 and P2 will be $V_{dd}-V_{gs9}$ no matter if deviations on the voltage source Vdd, temperature and/or manufacturing conditions occur. In other words, the high level and the low level can be dynamically adjusted with the deviations on the voltage source Vdd, temperature and/or manufacturing conditions.

In view of the foregoing, the current steering DAC with a voltage booster according to the present invention is advantageous in dynamically adjusting at least the low level at the control end of the DAC so as to enhance the operating speed of the DAC, enlarge the output swing range, improve the conversion linearity and resist to voltage deviation of the voltage source. It is to be noted that the present invention is not limited to a differential current type of DAC. Those skilled in the art may apply the similar principle to the designs of voltage boosters for use in a single-ended current steering DAC to achieve similar objects.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A digital-to-analog converter for converting a digital input into an analog output, coupled to a first voltage source and comprising:
   a load circuit for rendering the analog output;
   a switch circuit coupled to the load circuit and including at least one transistor for selectively conducting a current flow to the load circuit; and
   a voltage booster coupled to the at least one transistor, and providing a first gate-source voltage and a second gate-source voltage to generate a voltage of a first level according to the first voltage source and the first gate-source voltage, and to generate a voltage of a second level according to the voltage of the first level and the second gate-source voltage, thereby controlling the at least one transistor to be switched on so as to conduct the current flow to the load circuit in response to the voltage of the first level or the second level;
   wherein the first level and the second level vary with the first voltage source.

2. The digital-to-analog converter according to claim 1 wherein the voltage booster includes:
   a current replica circuit including a first transistor; and
   a switch replica circuit including a second transistor;
   wherein the first gate-source voltage is provided according to a voltage at a node between a gate and a source of the first transistor, and the second gate-source voltage is provided according to a voltage at a node between a gate and a source of the second transistor; and
   wherein the at least one transistor of the switch circuit is compatible with the second transistor for selectively conducting the current flow to the load circuit according to the voltage of the first level or the second level.

3. The digital-to-analog converter according to claim 2 wherein the voltage booster further includes a connection circuit coupling the voltage of the first level to the source or drain of the second transistor so as to provide the voltage of the first level and the voltage of the second level from the source and drain of the second transistor.

4. The digital-to-analog converter according to claim 3 wherein the connection circuit is a wiring between the gate of the first transistor and the source of the second transistor.

5. The digital-to-analog converter according to claim 3 wherein the connection circuit includes an operational amplifier which functions as virtual short circuit to couple the gate of the first transistor to the source of the second transistor.

6. The digital-to-analog converter according to claim 3 wherein the connection circuit includes a source follower including a third transistor compatible to the second transistor for providing a third gate-source voltage, wherein a voltage difference between the voltage of the first level and the third gate-source voltage is coupled to the drain of the second transistor.

7. The digital-to-analog converter according to claim 2 wherein the gate and drain of the second transistor are coupled to each other and the source of the first transistor is coupled to the first voltage source.

8. The digital-to-analog converter according to claim 2 further comprising:
a current source for providing a reference current, coupled to the switch circuit and including at least one transistor compatible with the first transistor for guiding the reference current to form the current flow to the load circuit.

9. The digital-to-analog converter according to claim 1 wherein the first level is substantially equal to a voltage difference between the first voltage source and the first gate-source voltage, and the second level is substantially equal to a voltage difference between the first voltage source and the second gate-source voltage.

10. A voltage booster of a digital-to-analog converter, comprising:
a first transistor having at least two electrodes and providing a first voltage between electrodes; and
a second transistor having at least two electrodes and providing a second voltage between electrodes;
wherein a voltage of a first level is generated according to a first voltage source and the first voltage between electrodes, a voltage of a second level is generated according to the first level and the second voltage between electrodes, and the voltage of the first level or the second level is selectively provided for the digital-to-analog converter to generate an analog output according to a digital input.

11. The voltage booster according to claim 10 wherein one of the two electrodes of the first transistor is coupled to the first voltage source so that a reference level is provided from the other of the two electrodes of the first transistor to provide the voltage of the first level, and one of the two electrodes of the second transistor is coupled to the reference level so that the voltage of the first level and the voltage of the second level are provided from the two electrodes of the second transistor, respectively.

12. The voltage booster according to claim 11, wherein the voltage of the first level or the second level is selectively provided to a current-guiding circuit of the digital-to-analog converter, which includes:
a current source for providing a reference current, including at least one transistor compatible with the first transistor for guiding the reference current;
a load circuit for rendering the analog output; and
a switch circuit coupled between the current source and the load circuit and including at least one transistor compatible with the second transistor for optionally conducting the flow of the reference current to the load circuit according to the voltage of the first level or the second level.

13. The voltage booster according to claim 11, further comprising a connection circuit coupling one of the two electrodes of the second transistor to the reference level.

14. The voltage booster according to claim 13 wherein the connection circuit is a wiring for connecting the first transistor and the second transistor so as to have the reference level directly coupled to the one of the two electrodes of the second transistor.

15. The voltage booster according to claim 13 wherein the connection circuit includes an operational amplifier which functions as virtual short circuit to couple the reference level provided by the first transistor to the one of the two electrodes of the second transistor.

16. The voltage booster according to claim 13 wherein the connection circuit includes a source follower including a third transistor which has at least two electrodes and provides a voltage between electrodes, wherein a voltage difference between the reference level and the third voltage between electrodes is coupled to the one of the two electrodes of the second transistor.

* * * * *